United States Patent
Harvey et al.

Patent Number: 6,027,950
Date of Patent: Feb. 22, 2000

[54] METHOD FOR ACHIEVING ACCURATE SOG ETCHBACK SELECTIVITY

[75] Inventors: Ian Robert Harvey, Livermore; Calvin Todd Gabriel, Cupertino, both of Calif.

[73] Assignee: VLSI Technology, Inc., San Jose, Calif.

[21] Appl. No.: 08/906,482

[22] Filed: Aug. 5, 1997

Related U.S. Application Data

[62] Division of application No. 08/601,137, Feb. 13, 1996, Pat. No. 5,821,163.

[51] Int. Cl.[7] .................................................. H01L 21/316
[52] U.S. Cl. ............................ 438/14; 438/631; 438/699; 156/646.1; 156/643.1
[58] Field of Search ............................... 438/14, 631, 699, 438/697, 710; 156/646.1, 643.1, 662.1

[56] References Cited

U.S. PATENT DOCUMENTS

| | | |
|---|---|---|
| 5,294,294 | 3/1994 | Namose . |
| 5,316,980 | 5/1994 | Takeshiro . |
| 5,378,318 | 1/1995 | Weling et al. . |
| 5,403,780 | 4/1995 | Jain et al. . |
| 5,449,644 | 9/1995 | Hong et al. . |
| 5,503,882 | 4/1996 | Dawson . |
| 5,639,345 | 6/1997 | Huang et al. . |

*Primary Examiner*—Charles Bowers
*Assistant Examiner*—Martin Sulsky
*Attorney, Agent, or Firm*—Wagner, Murabito & Hao LLP

[57] ABSTRACT

A method for preventing oxygen microloading of an SOG layer. In one embodiment of the present invention, hydrogen is introduced into an etching environment. An etching step is then performed within the etching environment. During the etching step an SOG layer overlying a TEOS layer is etched until at least a portion of the underlying TEOS layer is exposed. The etching step continues and etches at least some of the exposed portion of the TEOS layer. During etching, the etched TEOS layer releases oxygen. The hydrogen present in the etching environment scavenges the released oxygen. As a result, the released oxygen does not microload the SOG layer. Thus, the etchback rate of the SOG layer is not significantly affected by the released oxygen, thereby allowing for controlled etchback of the SOG layer.

3 Claims, 5 Drawing Sheets

METHOD FOR ACHIEVING ACCURATE SOG ETCHBACK SELECTIVITY

This a divisional of application Ser. No. 08/601,137 filed on Feb. 13, 1996, now U.S. Pat. No. 5,821,163.

TECHNICAL FIELD

The present claimed invention relates to the field of semiconductor device fabrication. More specifically, the present claimed invention relates to etchback selectivity of dielectric wafer coatings.

BACKGROUND ART

During conventional semiconductor manufacturing processes, numerous coatings are applied to and removed from semiconductor wafers. In one typical process, a layer of spin-on glass (SOG) is applied over the semiconductor wafer. The SOG is comprised of a low viscosity, highly carbonated $SiO_X$ compound in an alcohol carrier. The SOG is most frequently applied to improve the planarity of the layers deposited over the semiconductor wafer. That is, the SOG is a non-conformal substance which fills gaps, holes, or crevices in the underlying layers. Commonly, a desired amount of SOG is applied to the top upwardly-facing surface of the semiconductor wafer while the semiconductor wafer is being rotated. Thus, as the semiconductor wafer is rotated, the SOG spreads radially outward from the center of the semiconductor wafer towards the edge of the semiconductor wafer such that the entire top or active surface of the wafer is coated with a layer of SOG. The thickness of the SOG layer depends on the topography underlying the SOG layer.

Prior Art FIG. 1A, illustrates a prior art semiconductor manufacturing process step in schematic cross-section. As shown in Prior Art FIG. 1A, a semiconductor wafer 10 has metal lines 12 and 14, and an oxide film formed from tetraethylorthosilicate (TEOS) layer 16 disposed thereon. After highly conformal (i.e. uniform thickness independent of topography) TEOS layer 16 is deposited over metal lines 12 and 14 the topography above semiconductor wafer 10 is not planar. Specifically, gaps, holes, or crevices, shown in region 18, create an undesirable surface topography.

With reference next to Prior Art FIG. 1B, a non-conformal SOG layer 20 is shown deposited over TEOS layer 16. SOG layer 20 significantly planarizes the topography above semiconductor wafer 10. That is, SOG layer 20 reduces the severity or depth of the gap in region 18. As shown in Prior Art FIG. 1B, a slight depression still exists in region 18 even after the deposition of SOG layer 20.

As shown in Prior Art FIG. 1C, after the deposition of SOG layer 20, SOG is subjected to an etching process or "etchback". The etchback reduces the thickness of SOG layer 20. In Prior Art FIG. 1C, SOG layer 20 has been etched until it is relatively even with the exposed portion of TEOS layer 16 disposed on top of metal lines 12 and 14. As shown in Prior Art FIG. 1C, a slight gap still exists in region 18 after etching of SOG layer 20. To ensure that no SOG exists in subsequent vias for electrical connections to metal lines 12 and 14, SOG layer 20 and at least part but not all of the exposed portion of TEOS layer 16 must be removed from the top of metal lines 12 and 14. Thus, the exposed portion of TEOS layer 16 disposed on top of metal lines 12 and 14 will be partially removed. However, during the portion of the etch process when TEOS layer 16 is exposed, SOG layer 20 will also be etched in order to maintain a substantially planar topography above semiconductor wafer 10. In the prior art, etchback of SOG layer 20 and TEOS layer 16 is commonly performed in a fluorine- based reactive ion etching environment. As an example, a common fluorine-based compound is a mixture of freon 23 ($CHF_3$) and freon 14 ($CF_4$).

Referring now to Prior Art FIG. 1D, a side sectional view is shown. Prior Art FIG. 1D shows the topography of SOG layer 20 after the exposed portion of TEOS layer 16 has been partially etched from the top of metal lines 12 and 14. As illustrated by Prior Art FIG. 1D, the etching of the exposed portion of TEOS layer 16 from the top of metal lines 12 and 14 accelerates the etching rate of nearby SOG layer 20. That is, in region 18, SOG layer 20 is etched much more rapidly than the exposed portion of TEOS layer 16 was etched from the top of metal lines 12 and 14 because of the interaction of the TEOS layer 16 in the plasma. More specifically, the etch rate of SOG layer 20 is accelerated by the exposure of TEOS layer 16. As a result of the increased etch selectivity, the gap in region 18 deepens or becomes more severe. Thus, the gap-filling properties of SOG layer 20 are compromised. While such gaps may be tolerable in 0.8 micron-based processes, such gaps are not generally acceptable for 0.35 micron-based and tighter intermetal spacing processes due to interactions with subsequent layer processing which generates fatal defects.

The increased selectivity and "etchback" rate of SOG layer 20 near the etched portion of TEOS layer 16 is due to localized oxygen microloading. That is, when an oxygen-rich layer such as TEOS layer 16 is etched, oxygen is released into the plasma. Portions of SOG layer 20 located near the released oxygen adsorb the released oxygen. Such a process "loads" that portion of SOG layer 20 with oxygen. The oxygen reacts with carbon in SOG layer 20, forms carbon monoxide, and accelerates the rate at which SOG layer 20 is etched in region 18. In addition to deleteriously accelerating the local etchback rate of SOG layer 20, oxygen microloading also globally accelerates the SOG etch rate across the wafer. The etch rate dependence of SOG on oxygen exaggerates other more subtle process parameters such as SOG coat thickness and compositional variations.

As a further disadvantage, oxygen microloading inhibits empirically obtaining a reliable SOG/TEOS etch rate ratio. That is, in order to calculate or predict an SOG/TEOS etch rate ratio on a product wafer, the etch rate of SOG and TEOS are individually determined on flat, blanket wafers. However, when determining the etch rate for a blanket layer of SOG, it is extremely difficult to quantitatively determine factors such as oxygen microloading. Thus, the etch rate observed for an SOG layer by itself, does not necessarily reflect the actual etch rate of the SOG layer when it is etched concurrently with a TEOS layer. Likewise, the etch rate observed for a blanket layer of TEOS, does not necessarily reflect the actual product etch rate of TEOS when etched concurrently with SOG. Thus, the predicted ratio of SOG etchback to TEOS etchback, does not accurately reflect an actual SOG/TEOS etch rate ratio or selectivity. As a result, etch parameters based upon the predicted SOG/TEOS etch rate ratio do not always provide a predictable result. As shown in Prior Art FIG. 1D, etch parameters based upon a predicted SOG/TEOS etch rate ratio, result in deepening the gap in region 18. The etch unpredictability consequently results in reduced process margin and latitude.

With reference again to Prior Art FIG. 1C, once SOG layer 20 is deposited over TEOS layer 16, SOG layer 20 significantly planarizes the topography above semiconductor wafer 10. That is, after the deposition of SOG layer 20, only a slight gap remains in region 18. However, as shown in Prior Art FIG. 1D, etching of SOG layer 20 can degrade the planarity instead of improving the planarity as desired.

Thus, the need has arisen for a method which reduces or prevents oxygen microloading of an SOG layer, a method which achieves controlled etchback by generating a reliable SOG/TEOS etch rate ratio less dependent on the amount of oxygen in the plasma, and a method which achieves planarity on a semiconductor substrate.

DISCLOSURE OF THE INVENTION

It is therefore an object of the present invention to provide a method which reduces or prevents oxygen microloading of an SOG layer, a method which achieves controlled etchback by generating an SOG/TEOS etch rate ratio less dependent on the amount of oxygen in the plasma, and a method which achieves planarity on a semiconductor substrate. The above object has been achieved with a method which scavenges released oxygen by introducing hydrogen into the etching environment.

Specifically, in one embodiment, a method for preventing oxygen microloading of an SOG layer is disclosed. In one embodiment of the present invention, hydrogen is introduced into an etching environment. An etching step is then performed within the etching environment. During the etching step an SOG layer overlying a TEOS layer is etched until at least a portion of the underlying TEOS layer is exposed, resulting in an increased level of oxygen being released into the plasma. The hydrogen present in the etching environment chemically scavenges the released oxygen. As a result, the released oxygen is unavailable to interact with or microload the SOG layer. Thus, the etchback rate of the SOG layer is not significantly affected by the released oxygen, thereby allowing for controlled etchback of the SOG layer.

In another embodiment of the present invention, an accurate SOG/TEOS etch rate ratio is generated by placing an SOG coated semiconductor wafer into an etching environment containing hydrogen therein. In the present embodiment, oxygen is also added to the etching environment. The added oxygen simulates the release of oxygen from TEOS. An SOG coated semiconductor wafer is then etched in the hydrogen-containing etching environment under various etching parameters. The etch rates of the SOG coated semiconductor wafer are recorded for each of the various etching parameters. A TEOS coated semiconductor wafer is likewise etched in the hydrogen containing etching environment. The etch rates of the TEOS coated semiconductor wafer are also recorded for each of the various etching parameters. The etch rates of the SOG are compared with the etch rates of the TEOS. The comparison is used to determine which of the various etching parameters produces a desired ratio of SOG etch rate to TEOS etch rate. In so doing, the present invention provides for controlled etchback of an SOG/TEOS layer by providing etch predictability.

In yet another embodiment, a planar topography over a semiconductor substrate is achieved as follows. First, a layer of SOG is deposited over a non-planar layer of TEOS such that the layer of SOG substantially fills in gaps in the non-planar layer of TEOS. The SOG layer overlying the TEOS layer is then etched, in a hydrogen containing etching environment, until at least a portion of the TEOS layer is exposed. The exposed portion of the TEOS layer is also etched. Oxygen released from the TEOS layer during the etch step is scavenged by the hydrogen contained within the etching environment. Thus, the released oxygen does not microload the SOG layer. The etching of the SOG layer and the exposed portion of the TEOS layer continues until the SOG layer and the exposed portion of the TEOS layer form a substantially planar surface.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 2A:
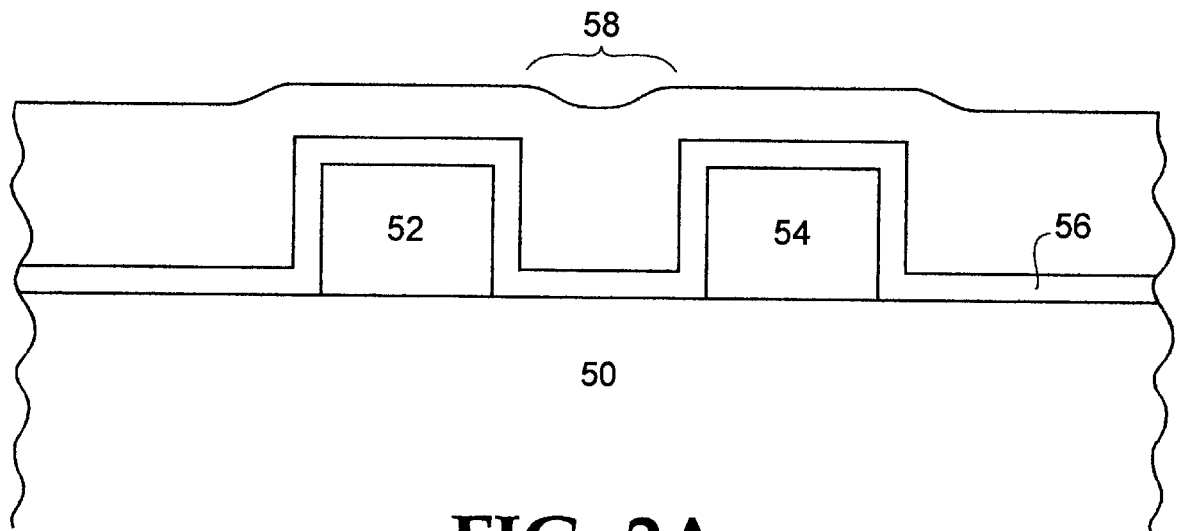
FIGS. 2A–2E are cross sectional views illustrating an SOG etchback process in accordance with the present claimed invention.

With reference now to FIG. 2A, a non-conformal SOG layer 60 is shown deposited over a TEOS layer 56. TEOS layer 56 covers metal lines 52 and 54 above semiconductor wafer 50. As mentioned above, SOG layer 60 significantly planarizes the topography above semiconductor wafer 50. That is, SOG layer 60 reduces the severity or depth of the gap in region 58. As shown in FIG. 2A, a slight depression still exists in region 58 even after the deposition of SOG layer 60.

Figure 2B:
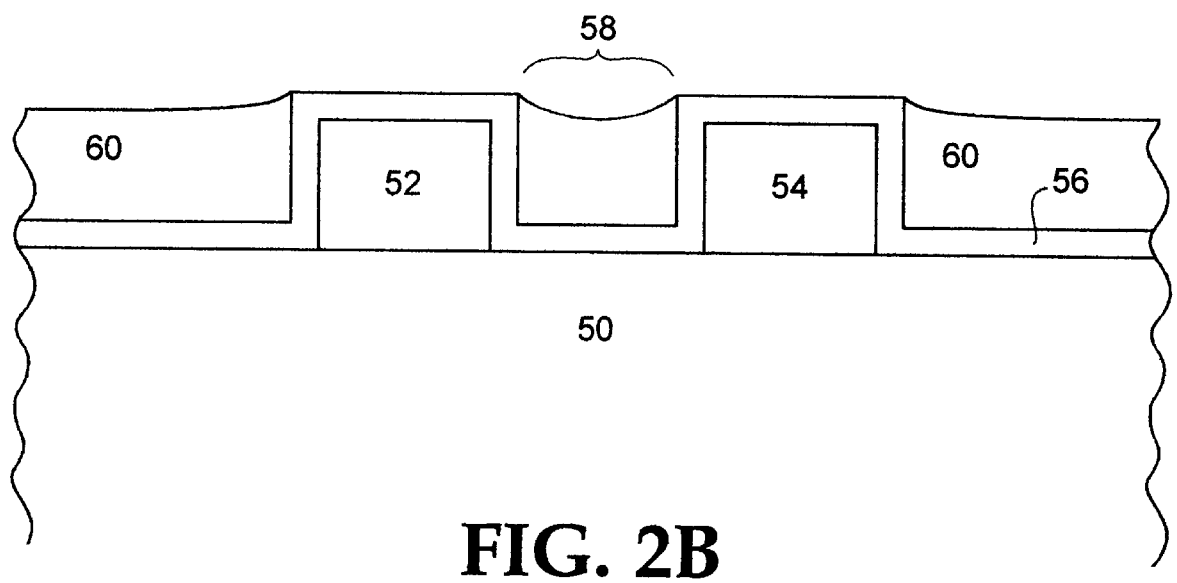

As shown in FIG. 2B, after the deposition of SOG layer 60, SOG is subjected to an etching process or "etchback". The etchback reduces the thickness of SOG layer 60. In the present invention, at least one of several hydrogen containing compounds is introduced into the reactive ion etching environment. It is well understood in the art that the etching environment consists of a vacuum area in which reactive ion etching occurs. In the present embodiment, hydrogen gas, $H_2$, is injected into the reactive ion etching environment. However, the present invention is also well suited to the use of hydrogen-containing compounds such as, for example, perfluorocarbons, $NH_3$, $SiH_4$, $CH_4$, and the like. In FIG. 2B, SOG layer 60 has been etched until it is relatively even with the exposed portion of TEOS layer 56 disposed on top of metal lines 52 and 54. As shown in FIG. 2B, a slight gap still exists in region 58 after etching of SOG layer 60.

As mentioned above, to ensure that no SOG exists over subsequent vias for electrical connections to metal lines 52 and 54, SOG layer 60 and at least part of the exposed portion of TEOS layer 56 must be removed from the top of metal lines 52 and 54. Thus, the exposed portion of TEOS layer 56 disposed on top of metal lines 52 and 54 will be partially removed. However, during the portion of the etch process when TEOS layer 56 is exposed, SOG layer 60 will also be etched. The concurrent etching of SOG layer 60 at a rate similar to that of the rest of TEOS layer 56 is necessary to maintain a substantially planar topography above semiconductor wafer 50.

Figure 2C:
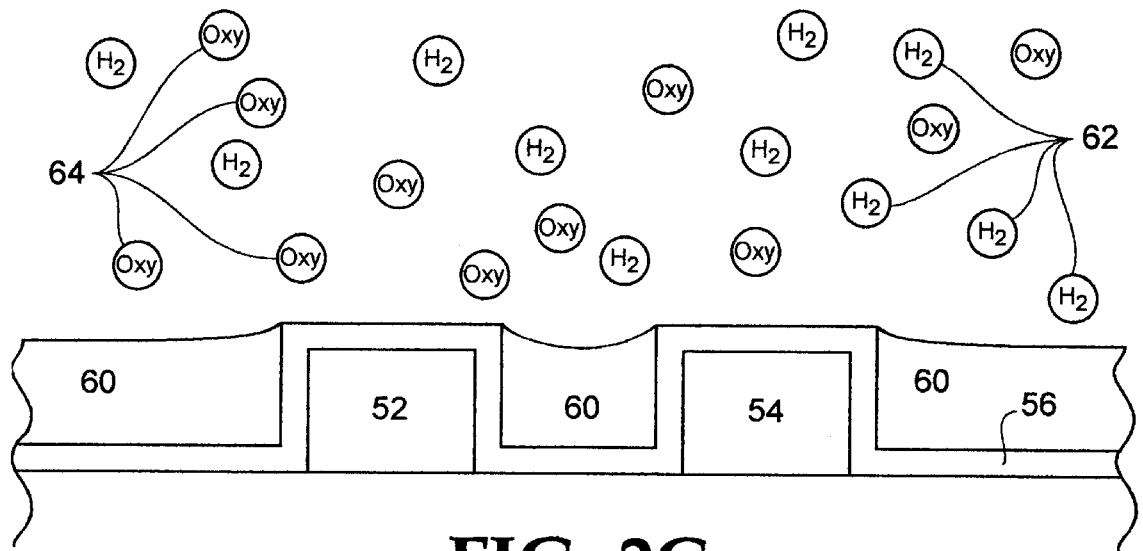

With reference now to FIG. 2C, hydrogen which was introduced into the reactive ion etching environment of the present invention is typically shown as spheres 62. It will be understood that the present depiction of hydrogen 62 is only intended to be illustrative. The depiction is not intended to be an actual representation of the size or quantity of hydrogen species present in the reactive ion etching environment.

Referring still to FIG. 2C, oxygen is liberated from TEOS layer 56 into the plasma during the etching of the exposed portion of TEOS layer 56 disposed on top of metal lines 52 and 54. The released oxygen is typically shown as spheres 64. As with hydrogen 62, it will be understood that the present depiction of oxygen 64 is only intended to be illustrative. The depiction is not intended to be an actual representation of the size or quantity of oxygen species present in the reactive ion etching environment.

The concept of electronegativity is useful to illustrate the operative principle. Electronegativity is roughly proportional to the sum of electron affinity and ionization potential. That is, electronegativity is a measure of an atom's ability to attract and retain electrons. On a relative (unitless) scale of 0 to 4, the difference between the electronegativity of carbon and oxygen is approximately 1. The difference between the electronegativity of hydrogen and oxygen is approximately 1.30. Thus, the difference in electronegativity between hydrogen and oxygen is approximately 30% greater than the difference in electronegativity between carbon and oxygen. As a result, oxygen will be more strongly attracted to hydrogen than carbon. The oxygen which reacts with the hydrogen is unavailable to interact with the carbon in the SOG.

Figure 2D:
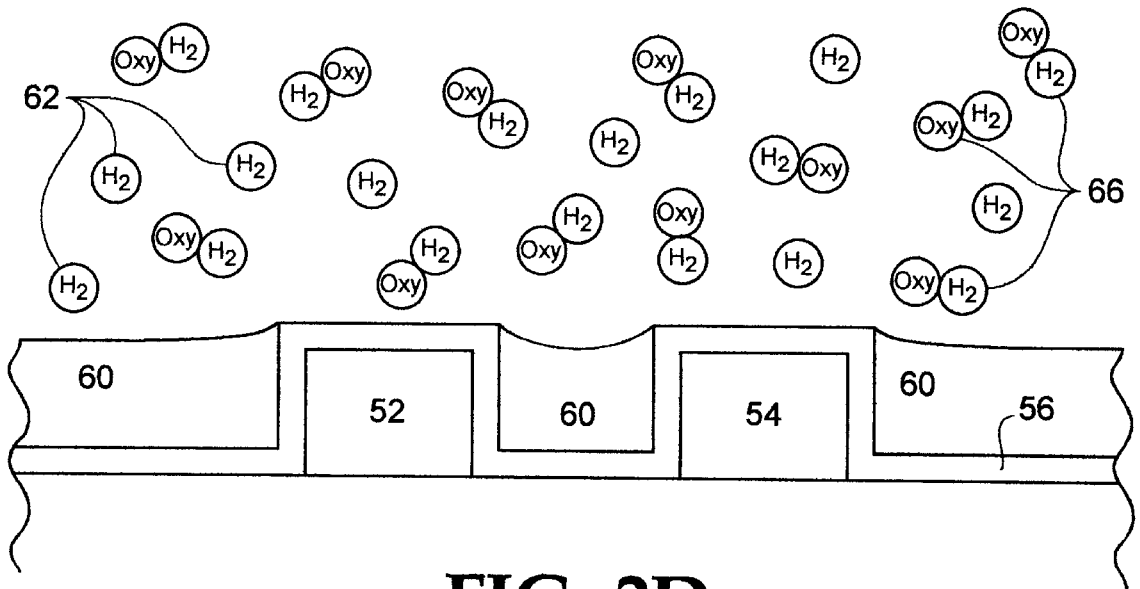

With reference next to FIG. 2D, a side sectional view illustrates the result of the oxygen being strongly attracted to the hydrogen. In the present invention the released oxygen 64 bonds to hydrogen 62 thereby forming molecules typically shown as 66. Again, it will be understood that the present depiction of molecules 66 is only intended to be illustrative. In the present embodiment, molecules 66 are comprised of two atoms of hydrogen 62 and one atom of oxygen 64. Therefore, water vapor ($H_2O$) is formed preferentially in the present embodiment. The water vapor is then exhausted from the reactive ion etching environment, along with other gases, into the vacuum effluent. Thus, in the present invention, the addition of hydrogen 62 prevents released oxygen 64 from attaching to carbon in SOG layer 60. Thus, the present invention prevents oxygen microloading of SOG layer 60. In the present invention, hydrogen 62 is said to "scavenge" the released oxygen 64.

The scavenging of released oxygen 64 by hydrogen 62 prevents the etch selectivity of SOG layer 20 from changing as a function of etch depth. That is, the present invention reduces local or global increases in the etch rate of SOG layer 60 due to exposure of TEOS layer 56. Thus, the present invention allows for controlled etchback of an SOG/TEOS layer by providing etch predictability. To determine the etch rate for a given substance such as SOG, an unpatterned wafer coated only with SOG is etched in a standard reactive ion etching environment. For example, with a certain reactor and under certain test conditions, etch rate of SOG is approximately 30 angstroms per second. Furthermore, under the same test conditions, the etch rate of TEOS is approximately 90 angstroms per second. Hence, the test etch rate ratio of SOG to TEOS is approximately 1 to 3. Therefore, it would be expected that during a concurrent etch of both SOG and TEOS, the TEOS layer would be etched at a rate three times faster than the rate at which the SOG layer is etched to a depth three times greater than the depth to which the SOG layer is etched. However, in the prior art when SOG and TEOS are etched concurrently, the SOG layer is etched much more rapidly than expected due to localized oxygen microloading. The accelerated etch rate of the SOG layer may compromise the gap-filling properties of the SOG layer.

Figure 1A:
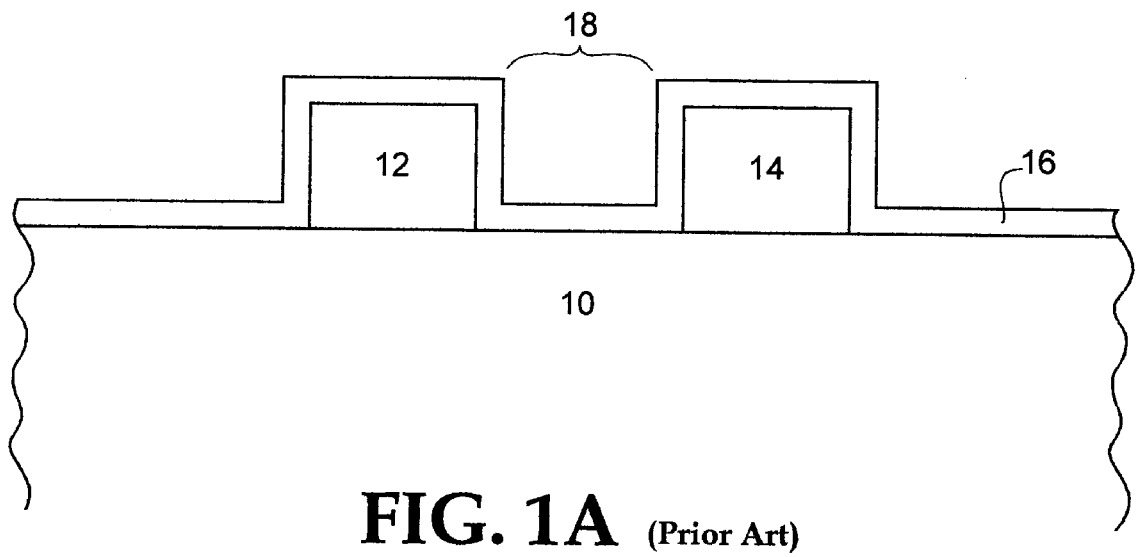
FIG. 1A–1D are cross sectional views illustrating steps associated with a prior art SOG etchback process.
Figure 1B:
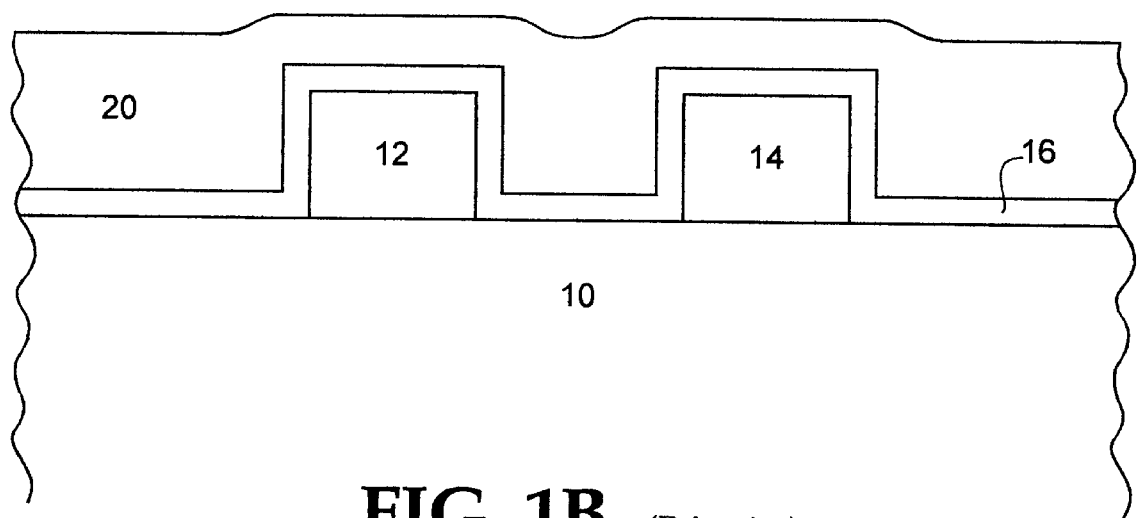
Figure 1C:
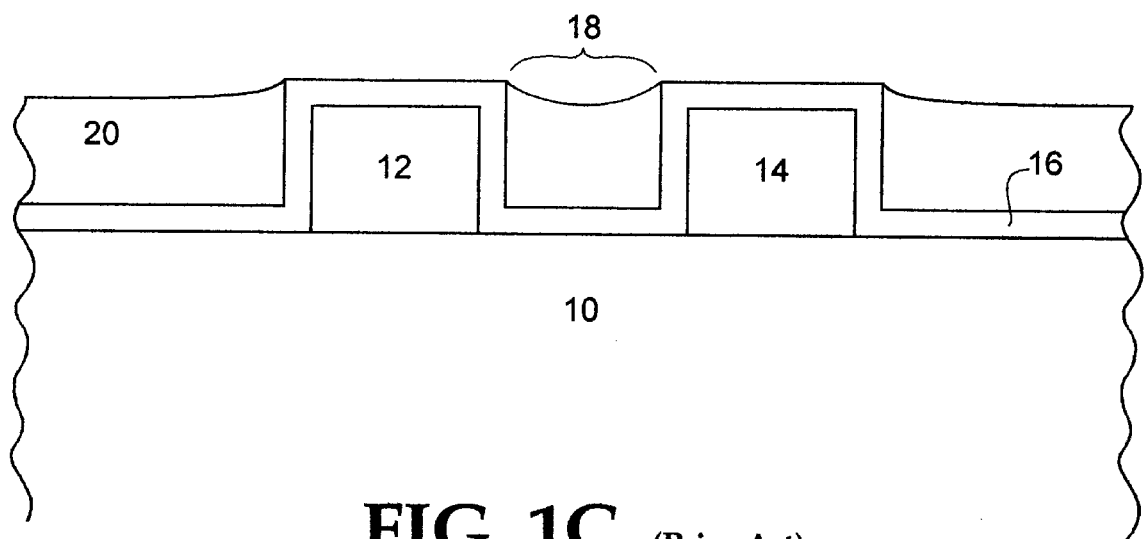
Figure 1D:
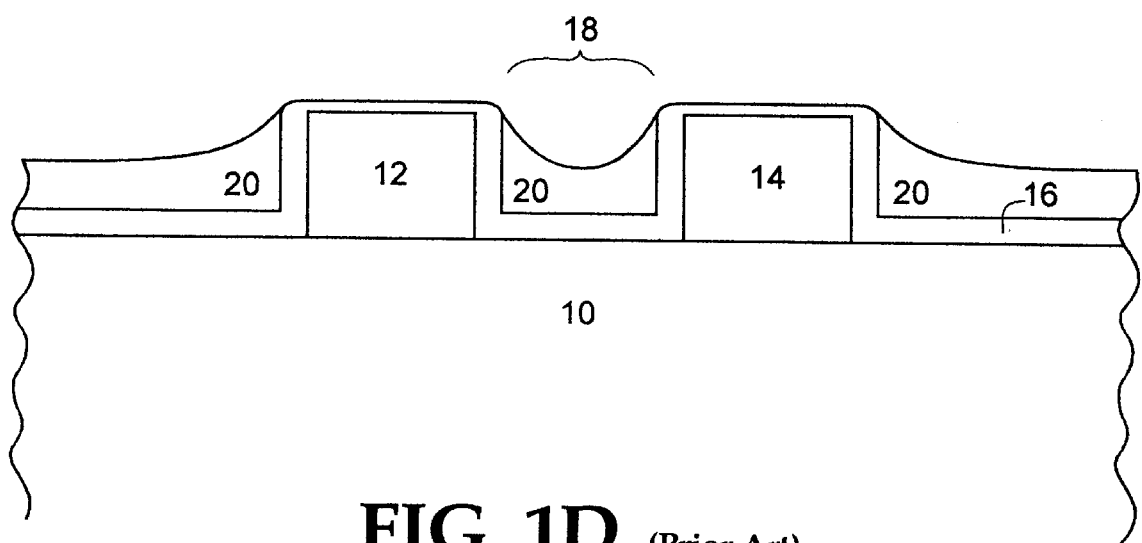

In one embodiment of the present invention, the test semiconductor wafers are etched in a reactive ion etching environment including hydrogen in accordance with the present claimed invention. By including hydrogen in the reactive ion etching environment, the test etch rate accurately reflects the actual etch rate of patterned semiconductor wafers. That is, in the present hydrogen-containing etch environment, parameters such as temperature, primary etch gas composition, etch duration, and the like are adjusted until a desired test etch rate ratio of SOG to TEOS is achieved. In the present embodiment, oxygen is also added to the etching environment. The added oxygen in etch rate tests simulates the release of oxygen from TEOS on product wafers. In one embodiment, the etching environment parameters are altered to achieve a 1 to 1 SOG to TEOS etch rate ratio. By obtaining a 1 to 1 SOG to TEOS etch rate ratio, and adding hydrogen to scavenge oxygen, the SOG layer and the TEOS layer are etched equally on test wafers as well as on a product wafer. As a result, the present invention prevents deepening of gaps present, for example, in region 18 of Prior Art FIG. 1D. Furthermore, by adding etch rate predictability, the present invention increases process margin and latitude.

In the present embodiment, for every standard cubic centimeter per minute (sccm) of oxygen which is expected to be released from the etched TEOS layer, about 2 sccm of hydrogen are introduced into the reactive ion etching environment. Such a ratio of added hydrogen to released oxygen eliminates oxygen microloading.

Figure 2E:
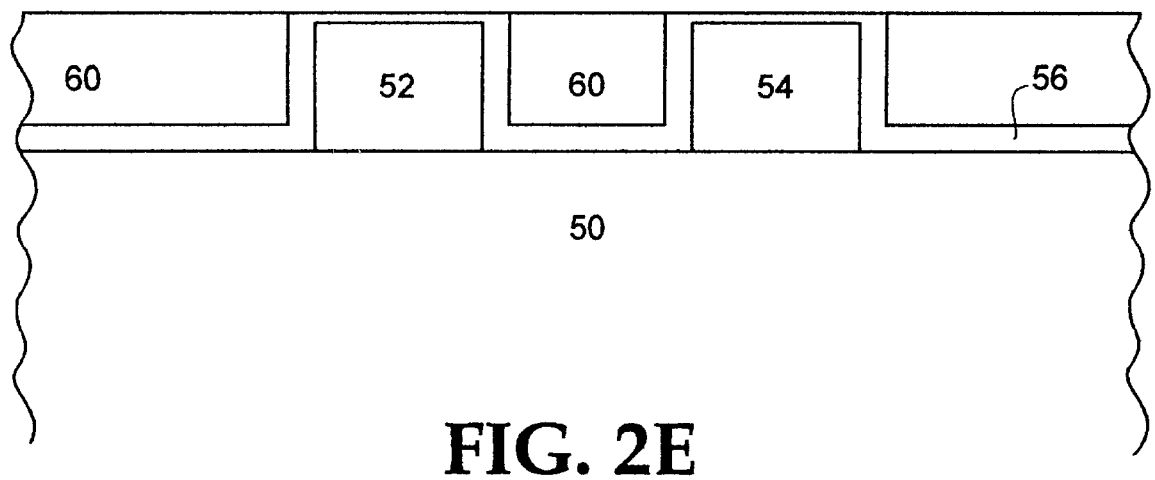

With reference next to FIG. 2E, a side sectional view of a SOG layer 60 etched according to one embodiment of the present invention is shown. In the embodiment of FIG. 2E, SOG layer 60 is substantially even or planar over the entire surface of semiconductor wafer 50. That is, no substantial gaps, holes, or crevices are present. In the present embodiment, in the present hydrogen containing etch environment parameters are altered to achieve a SOG to TEOS etch rate ratio which is slightly greater than 1. That is, the etch rate of TEOS is slightly greater than the etch rate of SOG. As a result, unlike the prior art, planarity is improved even during the etching of exposed TEOS. Thus, the present embodiment provides planarity which is greater than was achieved after the initial application of SOG layer 60.

Thus, the present invention provides a method which prevents oxygen microloading of an SOG layer, a method which achieves controlled etchback by generating a reliable SOG/TEOS etch rate ratio, and a method which achieves planarity on a semiconductor substrate.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:

1. A method for accurately generating an SOG/TEOS etch rate ratio comprising the steps of:

placing an SOG coated semiconductor wafer into an etching environment containing hydrogen therein;

etching said SOG coated semiconductor wafer in said hydrogen containing etching environment under various etching parameters;

recording first etch rates of said SOG coated semiconductor wafer achieved at said various etching parameters;

placing a TEOS coated semiconductor wafer into said etching environment containing hydrogen therein;

etching said TEOS coated semiconductor wafer in said hydrogen containing etching environment under said various etching parameters;

recording second etch rates of said TEOS coated semiconductor wafer achieved at said various etching parameters;

comparing said first and second etch rates; and determining under which of said various etching parameters a desired ratio of said first etch rate to said second etch rate is achieved.

2. The method for accurately generating an SOG/TEOS etch rate ratio as recited in claim 1 wherein said step of determining under which of said various etching parameters a desired ratio of said first etch rate to said second etch rate is achieved further comprises the steps of:

determining under which of said various etching parameters said first etch rate is equal to said second etch rate.

3. The method for accurately generating an SOG/TEOS etch rate ratio as recited in claim 1 wherein said step of determining under which of said various etching parameters a desired ratio of said first etch rate to said second etch rate is achieved further comprises the steps of:

determining under which of said various etching parameters said first etch rate is slightly less than or equal to said second etch rate.

* * * * *